United States Patent
Shimizu

(10) Patent No.: US 8,077,811 B2
(45) Date of Patent: Dec. 13, 2011

(54) RECEIVING APPARATUS

(75) Inventor: Masakazu Shimizu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 462 days.

(21) Appl. No.: 12/370,620

(22) Filed: Feb. 13, 2009

(65) Prior Publication Data

US 2009/0207948 A1    Aug. 20, 2009

(30) Foreign Application Priority Data

Feb. 14, 2008 (JP) ................. 2008-033382

(51) Int. Cl.
    *H04L 27/06* (2006.01)
(52) U.S. Cl. ...................................... 375/341
(58) Field of Classification Search .......... 375/262, 375/341; 714/795
    See application file for complete search history.

(56) References Cited

U.S. PATENT DOCUMENTS

| | | | |
|---|---|---|---|
| 7,162,675 B2 | 1/2007 | Das et al. | |
| 7,200,788 B2 | 4/2007 | Hiraki et al. | |
| 7,340,670 B2 | 3/2008 | Natori | |
| 2003/0095605 A1 | 5/2003 | Das et al. | |
| 2004/0252794 A1* | 12/2004 | Hwang et al. | 375/341 |
| 2007/0136634 A1 | 6/2007 | Hiraki et al. | |
| 2008/0298513 A1* | 12/2008 | Gezici et al. | 375/341 |
| 2009/0100319 A1* | 4/2009 | Potkonjak et al. | 714/792 |
| 2010/0266007 A1* | 10/2010 | Kim et al. | 375/233 |

FOREIGN PATENT DOCUMENTS

| | | |
|---|---|---|
| JP | 2003-209891 | 7/2003 |
| JP | 2003-318745 | 11/2003 |
| JP | 2004-073346 | 8/2004 |
| JP | 2005-94650 | 4/2005 |

* cited by examiner

*Primary Examiner* — Don N Vo
(74) *Attorney, Agent, or Firm* — Young & Thompson

(57) ABSTRACT

For each of a plurality of control channels, a likelihood indicated by a state metric of each state at the last point which is obtained at the time of Viterbi decoding is obtained. This Viterbi decoding is not cut off and performed to convolutionally coded data of the corresponding control channel. The ranking of the likelihood is obtained as a possibility ranking SM0RANK indicating the possibility of the control channel to be a control channel for a particular receiving apparatus. From the plurality of control channels, the control channels with the possibility ranking SM0RANK more or equal to a predetermined threshold are selected as candidate channels. An output likelihood of each candidate channel which is obtained in the Viterbi decoding is normalized with a receiving intensity of the corresponding candidate channel to detect a candidate channel having the highest normalized output likelihood as the control channel for the receiving apparatus.

15 Claims, 14 Drawing Sheets

US 8,077,811 B2

RECEIVING APPARATUS

FIELD OF THE INVENTION

The present invention relates to a technique for detecting a control channel for a particular receiving apparatus from a plurality of control channels received.

DESCRIPTION OF RELATED ART

In the field of wireless communications, the following communication method is used: a base station transmits control channel and data channel data and then a user equipment obtains control information from the control channel data to receive and decode data channel data according to the control information.

For example, HSDPA (High Speed Downlink Packet Access) based on the specification of 3GPP (3rd Generation Partnership Project) defines HS-SCCH (High Speed-Shared Control Channel) and HS-PDSCH (High Speed Physical Downlink Shared Channel) as a control channel and a data channel. The information concerning HS-PDSCH is stored in HS-SCCH. A user equipment obtains these information from HS-SCCH to receive and decode HS-PDSCH (see Japanese Unexamined Patent Application Publication No. 2003-209891).

FIG. 12 is a pattern diagram illustrating generation of a HS-SCCH frame by a sender. The HS-SCCH frame consists of two sections called PART1 and PART2. The PART1 and PART2 are encoded separately. Firstly, the PART1 is explained.

As shown in FIG. 12, a 8-bit information bit sequence X1 obtained in a multiplexing process (MUX) of a step S10 is convolutionally coded with the code rate of ⅓ to be 48-bit bit sequence Z1 (S12). The puncture process for removing a particular bit in order to adjust data rate is given to the bit sequence Z1 to be a 40-bit bit sequence R1 (S14). The bit sequence R1 is masked by an exclusive OR with Xue to be a bit sequence S1 (S16). Note that Xue is a 40-bit bit sequence obtained by convolutionally coding a 16-bit ID (UEID) which is given to a destination user equipment (hereinafter referred to as UE) with the coding rate of ½ and then performing a puncture process. A UEID is different for each UE.

The bit sequence S1 obtained herewith forms the PART1 of a HS-SCCH frame and includes the information for receiving HS-PDSCH.

As for the PART2, an information bit sequence X2, which is obtained by a multiplexing process (MUX) of a step S20, is convolutionally coded (S24) and punctured (S26) to be a bit sequence R2. Before the convolutional coding process of a step S24, a CRC bit is attached (S22). It is noted that the bit sequence R2 forms the PART2 of a HS-SCCH frame and includes the information for decoding HS-PDSCH and CRC.

The bit sequences R1 and R2 are mapped to a physical channel to be transmitted as a HS-SCCH frame.

FIG. 13 shows a frame structure and a receive timing of HS-SCCH and HS-PDSCH. As shown in the figure, the HS-SCCH frame includes three slots and one frame length is 2 ms. The first slot1 is PART1. A slot2 and a slot3 form PART2. Moreover, one frame of the HS-PDSCH also includes three slots and one frame length is 2 ms. As for the receive timing, the HS-SCCH frame is started first. Upon completion of receiving the slot2 of the HS-SCCH frame, reception of the first slot (slot1) of the HS-PDSCH is started.

A UE carries out the reverse process to the sender for the received HS-SCCH frame to obtain the control information included in the PART1 and PART2. Then the UE refers to the control information so as to receive and decode the HS-PDSCH frame. As shown in FIG. 13, the entire PART2 of the HS-SCCH frame has not received yet at the time of starting to receive the HS-PDSCH frame. Thus the reception process of the HS-PDSCH is based on the information of the PART1.

As mentioned above, the PART1 and PART2 of the HS-SCCH are separately encoded. Therefore UE can receive HS-PDSCH using the decoded result of the PART1 before decoding of the PART2 is completed.

Unmasking, depuncture process and Viterbi decoding are included in the processes related to the decoding of the PART1. Unmasking is performed by obtaining an exclusive OR of Xue generated from a UEID of the UE itself and the bit sequence of the slot1. The depuncture process is a process to refill a certain bit, that is, the reverse process to the puncture process which is performed by the sender in order to adjust data rate.

HSDPA defines that a UE can receive up to four HS-SCCH frames at a time. In the event of receiving a plurality of HS-SCCH frames, a UE needs to detect the one for the UE from the plurality of HS-SCCH frames. This detection process is carried out based on the information of PART1 of each HS-SCCH frame. As a CRC is not included in the PART1 of HS-SCCH, the UE obtains the information of the PART1 without detecting errors so as to carry out the aforementioned detection.

As mentioned above, the PART1 of a HS-SCCH frame received by the UE is masked by an UEID of a receiver. The UE unmasks with its UEID before performing Viterbi decoding. Accordingly, unmasking cannot be successfully performed unless by a HS-SCCH frame for the UE, the likelihood of the Viterbi decoding result must be low.

In the light of this point, there are various methods suggested for detecting a HS-SCCH for a particular UE from a plurality of HS-SCCH frames. Japanese Patent No. 3668492 (p. 6, lines 35-38) mentions the usage of an output likelihood of a Viterbi decoder in detection of a control channel for a particular UE.

Moreover, Japanese Unexamined Patent Application Publication No. 2003-318745 discloses the method to perform the abovementioned detection using a path metric difference which is obtained at the time of decoding by a Viterbi decoder.

Usually a state metric value (SM) and a path metric difference (PMD) of the decoded result are used for the output likelihood of the Viterbi decoder.

The state metric value SM of the decoded result is the distance between a decoded result and received data. The shorter the distance, the higher the reliability of the decoded result and the output likelihood.

The path metric difference PMD is a difference between a path metric of a path which leads the decoded result, i.e. a survivor path, and a path metric of a discarded path. A minimum path metric difference (MPMD), an aggregate path metric difference (APMD) and a frequency path metric difference (FPMD) are usually used as the output likelihood.

The minimum path metric difference MPMD is the value with the lowest likelihood among path metric differences at each point of the survivor path. The larger the minimum path metric difference MPMD, the higher the reliability of the survivor path and eventually the higher the output likelihood.

The aggregate path metric difference APMD is the sum of path metric differences at each point of the survivor path in the trellis. As also for the APMD, the higher the value, the higher the reliability of the survivor path and the output likelihood.

The frequency path metric difference FPMD is the number of points in which the path metric difference is smaller than a predetermined threshold in the survivor path. The larger the FPMD, the higher the reliability of the survivor path and the output likelihood.

SUMMARY

By the way, each of the abovementioned parameter used as the output likelihood is largely influenced by the amplitude and amount of noise in received data of the control channel. The minimum path metric difference MPMD is explained as an example here.

FIG. 14 shows data (40 bits) of PART1 of a HS-SCCH frame of a channel0 (CH0) and a channel1 (CH1). The vertical axis indicates the data value. Noise is not considered in the figures for ease of explanation. It is noted that in binary expression of data, positive data values are regarded as "0" and negative data values are regarded as "1". Larger absolute values are more "likely to be 0" or "likely to be 1".

When decoding by a UEID of a UE corresponding to CH0 at the time of decoding the data shown in FIG. 14, the correct detection result is that CH0 is for the UE and CH1 is for some other UE. Moreover, when decoding by the UEID of the UE corresponding to CH1, the correct detection result is that CH1 is for the UE and CH0 is for some other UE.

Before decoding, by adjusting the receiving intensity so that the maximum absolute value is to be 1 for the two data, the two data shown in FIG. 14 become as shown in FIG. 15. Since the maximum absolute value of the data of CH0 is large, the value of a bit other than the bit having the amplitude same as the maximum value in the data of CH0 is relatively smaller than that in the data of CH1.

As a result of decoding the data of two channels shown in FIG. 15 by the UEID of CH0, the minimum path metric difference MPMD obtained for CH0 and CH1 are "1.2435v" and "1.6619", respectively.

Regarding this point, in the method disclosed in Japanese Unexamined Patent Application Publication No. 2005-94650, the data of CH1 is detected as the one for the UE which includes the UEID of CH0, as the minimum path metric difference MPMD of CH0 is larger. This is because that as the maximum absolute value of the data of CH0 is large, the change in the path metric is small at the point when the amplitude was made relatively small as a result of the adjustment of the receiving intensity, thereby making it difficult to generate a difference.

The present inventors have found a problem that the output likelihood of a Viterbi decoder such as the path metric difference is influenced by the receiving intensity and it is easy to make incorrect detections in a comparison of the output likelihood of each control channel which is obtained at the time of decoding. Moreover, the same problem arises when the amplitude of noise is large as the amplitude of data becomes relatively small.

A first exemplary aspect of an embodiment of the present invention is a receiving apparatus. The receiver includes a decoder, a calculating unit and an evaluation unit.

The decoder executes a Viterbi algorithm to data included in a first channel to output a state metric of a state existing in a first point in a trellis diagram and executes a Viterbi algorithm to data included in a second channel to output a state metric of a state existing in a second point in the trellis diagram.

The calculator outputs a first and a second relative relationships. The first and the second relative relationships are relationships between a state metric of a certain state to start traceback existing in each of the first and the second points and a state metric of a different state existing in each of the first and the second The evaluation unit determines one of the first arid the second channels as a channel to select according to the first and the second relative relationships.

Another exemplary aspect of an embodiment of the present invention is also a receiving apparatus. The receiving apparatus includes a decoder, a receiving intensity obtaining unit and an evaluation unit.

The decoder executes a Viterbi algorithm to data included in a first channel so as to calculate a first likelihood for a certain state to start traceback among states existing at a first point in a trellis diagram and executes a Viterbi algorithm to data included in a second channel, which is different from the first channel, so as to calculate a second likelihood for a certain state to start traceback among states existing at a second point in the trellis diagram.

The receiving intensity obtaining unit calculates a partial sum or a sum of absolute values of data included in the first channel and a partial sum or a sum of absolute values of data included in the second channel.

The evaluation unit normalizes the first and the second likelihood respectively by the partial sum or the sum of the first channel and by the partial sum or the sum of the second channel and determines that one of the first and the second channels is a channel to select based on the normalized first and the second likelihoods.

It is noted that a method or a system replacing the apparatus of the abovementioned embodiment or a program which operates a computer as the abovementioned apparatus is effective as an embodiment of the present invention. Furthermore, a combination of the above embodiments may be effective as an embodiment of the present invention.

The technique of the present invention enables to accurately detect a control channel for a particular UE among a plurality of received control channels.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The principle of the technique according to an exemplary embodiment of the present invention is described before explaining specific embodiments of the present invention.

Upon detection of a control channel for a particular receiving apparatus among a plurality of control channel data received at a time, the inventors have established the following two methods as a result of keen study on the improvement of detection accuracy while eliminating the influence of receiving intensity and noise.

Figure 1:
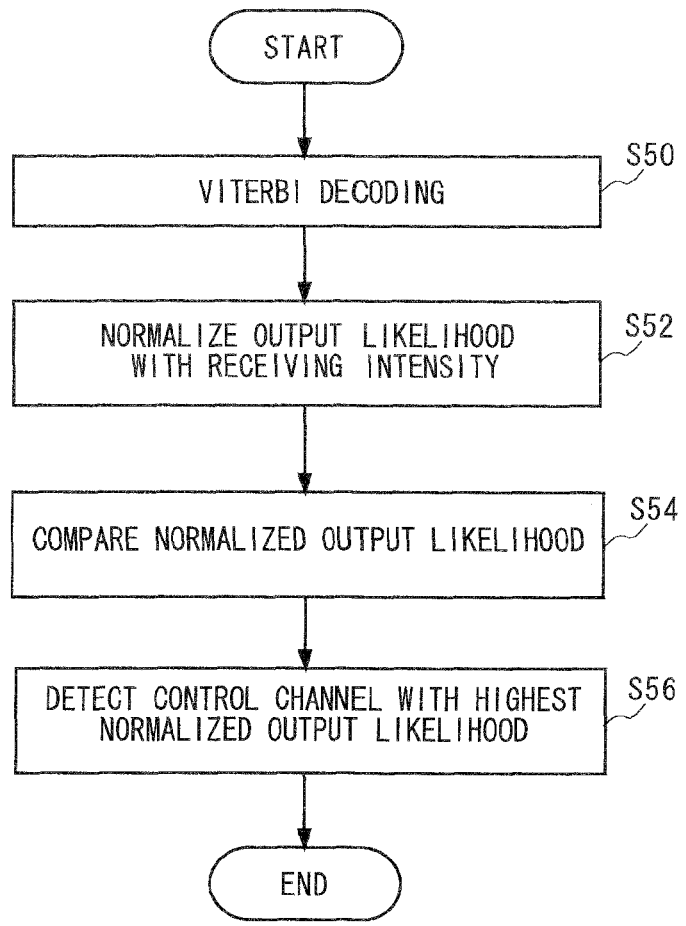
FIG. 1 is a flowchart showing a first method according to an exemplary embodiment of the present invention.

FIG. 1 is a flowchart showing the first method established by the inventors. First, Viterbi decoding is performed to each data of a plurality of received control channels (S50). An output likelihood is obtained for each control channel by the Viterbi decoding. Any one or combination of the following likelihood can be used as the output likelihood in each state existing at a respective point in the trellis diagram; a likelihood indicated by a minimum path metric difference MPMD, a likelihood indicated by an aggregate path metric difference APMD and a likelihood indicated by a frequency path metric difference FPMD. Each likelihood is for the state to start traceback. The traceback here indicates the process to trace back a decoding path in the trellis diagram, which is obtained according to a state metric so as to obtain decoded data. This state metric executes a Viterbi algorithm and indicates the probability of a path resulting in each state in the trellis diagram. The state to start traceback is the state 0 in the trellis diagram, for example when a termination bit is inserted, where the termination bit is composed of a bit sequence for data input to a convolutional encoder of a data sender. Therefore in this case, the output likelihood is the minimum path metric difference which is calculated from a decoding path that reaches to the state 0 in the trellis diagram. At the step 50, the Viterbi algorithm is performed for every control channel to obtain the output likelihood for the state to start traceback for each control channel.

As "a likelihood indicated by the minimum path metric difference MPMD", the minimum path metric difference MPMD can be used. As "a likelihood indicated by the aggregate path metric difference APMD", the aggregate path metric difference APMD can be used. As "a likelihood indicated by the frequency path metric difference FPMD", the value calculated by subtracting the frequency path metric difference FPMD from the total points can be used. An inverse number of the frequency path metric difference can also be used. Moreover, a sum, an average and a weighted average may be calculated for the combination.

Next, the output likelihood for each control channel which is obtained in the step S50 is normalized with the receiving intensity of the corresponding control channel (S52). A sum or a partial sum of the absolute values of the data of this control channel can be used as the receiving intensity, for example. As for the normalization, if the minimum path metric difference MPMD or the aggregate path metric difference APMD is used for the output likelihood, a normalized output likelihood which is normalized by dividing the output likelihood by the above sum or partial sum for each control channel is obtained. If the frequency path metric difference FPMD is used for the output likelihood, a threshold corresponding to the above sum or partial sum is calculated for each control channel and a frequency path metric calculated using the threshold is obtained as a normalized output likelihood.

The normalized output likelihood obtained in the step S52 is compared between the control channels. The control channel with the highest normalized output likelihood is detected as a control channel for the receiving apparatus (S54 and S56). That is, the output likelihood for one state in the trellis to start traceback is calculated for each of the received control channel, normalized and compared between the control channels to evaluate a channel to be selected.

Figure 15:
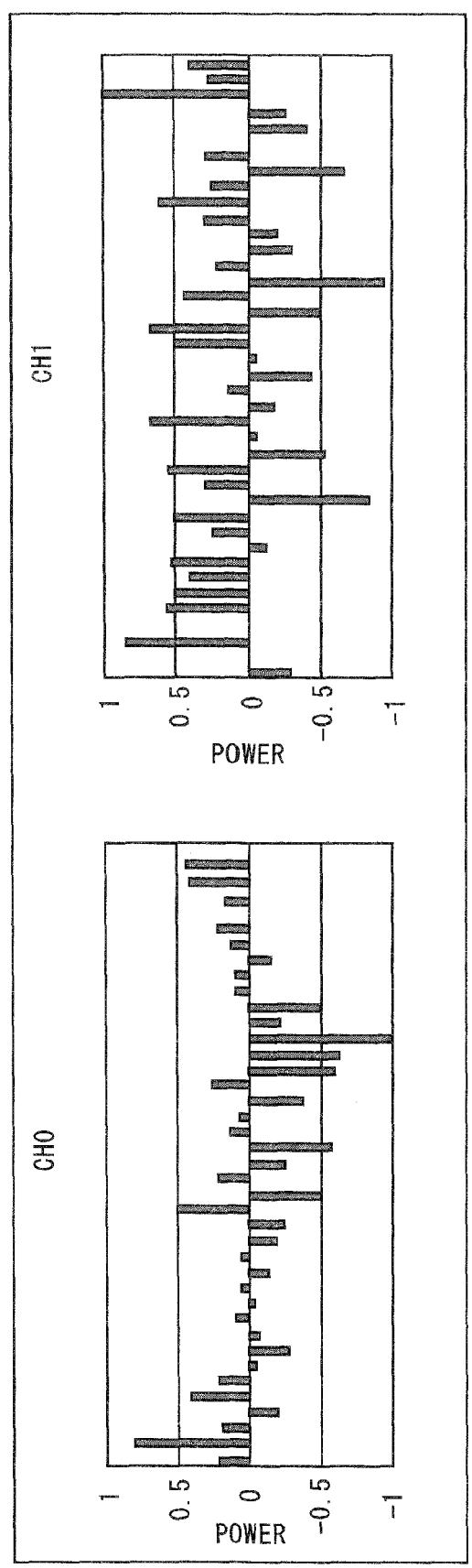
FIG. 15 shows data values after adjusting to have the same maximum amplitudes of the two data shown in FIG. 14.

Accordingly, as an indicator for the probability of the control channel being for a particular receiving apparatus (hereinafter also referred as a channel for a particular receiving apparatus), the first method uses the output likelihood normalized with the receiving intensity of data of the corresponding control channel. For example, as for CH0 and CH1 data shown in FIG. 15, the sum of the absolute values of the data is respectively "10.4995" and "15.2944". Moreover, as mentioned above, as a result of decoding by the UEID of CH0, the minimum path metric differences MPMD obtained for CH0 and CH1 are "1.2435" and "1.6619", respectively. When normalizing the minimum path metric difference MPMD with the receiving intensity (which is the sum or partial sum of the absolute values of data here), a normalized MPMD of CH0 and CH1 become respectively "0.1184" and "0.1087". The normalized MPMD of CH0 is larger. Thus, CH0 can be correctly selected as a channel for the receiving apparatus.

In this way, the first method enables to eliminate the influence of receiving intensity and noise and also improve the accuracy in detecting a channel for the receiving apparatus.

The inventors have set another indicator for the probability to be a channel for the receiving apparatus and established a second method, which is not influenced by the receiving intensity or noise, in a different approach from the above first method.

Usually, when performing Viterbi decoding, decoding is cut off by a truncation length and the traceback is started from the state having a state metric with the highest likelihood at the point of the cutoff in the trellis. Then, the obtained data as a result of the traceback is the decoded result. The state with high likelihood of a state metric indicates the state having the smallest state metric value SM among the states existing in the points in the trellis diagram in which the execution of Viterbi algorithm has been cut off. It is noted that as a state metric is the sum of branch metric which indicates the probability of transiting from a state at a certain point to a state at the next point in the trellis diagram, the relationship between the size of the value and the likelihood of the state metric changes according to which parameter to use as the branch metric. For example, when using a hamming distance between received data and data corresponding to a branch as the branch metric, the state with a smaller state metric in the trellis has a higher likelihood. However when using a different parameter as the branch metric, the state with a larger state metric in the trellis has higher likelihood.

By the way, there are only 16 points for decoding PART1 of a HS-SCCH frame, for example. For such data with a small number of points, the data is not cut off and decoded to the end. On the other hand, in case of convolutional coding, the internal state of the encoder is set back to the state S0 (state S0 is the state 0 in the trellis diagram). Therefore, when decoding without cutoff, the state to start traceback is the state 0 at the last point in the trellis diagram. That is, the decoded result is produced by the traceback which starts from the state S0. The state corresponding to the decoded result is the state 0.

Accordingly, as a result of decoding data of a control channel which is for the receiving apparatus, the state metric value SM at the state 0 should be the smallest among state metric value SM of each state at the last point. In the following explanation, the state metric value SM at the last point state S0 is referred to as SM0.

The inventors focused attention on this point and established the second method which uses a ranking of likelihood of the state metric SM0 for the state 0 among the state metric value SM of each state at the last point in the trellis at the time of decoding a control channel. The ranking is used as an indicator for the probability of the corresponding control channel to be the control channel for the corresponding receiving apparatus. Hereinafter, this ranking is referred to as a possibility ranking SM0RANK. It is noted that the probability ranking generally means the ranking to indicate how the likelihood ranks among the state metric of each state included in a point where a certain state exists in the trellis diagram to start traceback. In the following examples, assume the condition where a termination bit is inserted to the convolutional encoder by the data sender and the state to start traceback is the state 0 in the trellis diagram. That is, the possibility ranking in this embodiment represents how the likelihood of the state metric in the state 0 at the last point of the trellis ranks as compared to the state metrics of other states at the last point.

Figure 2:
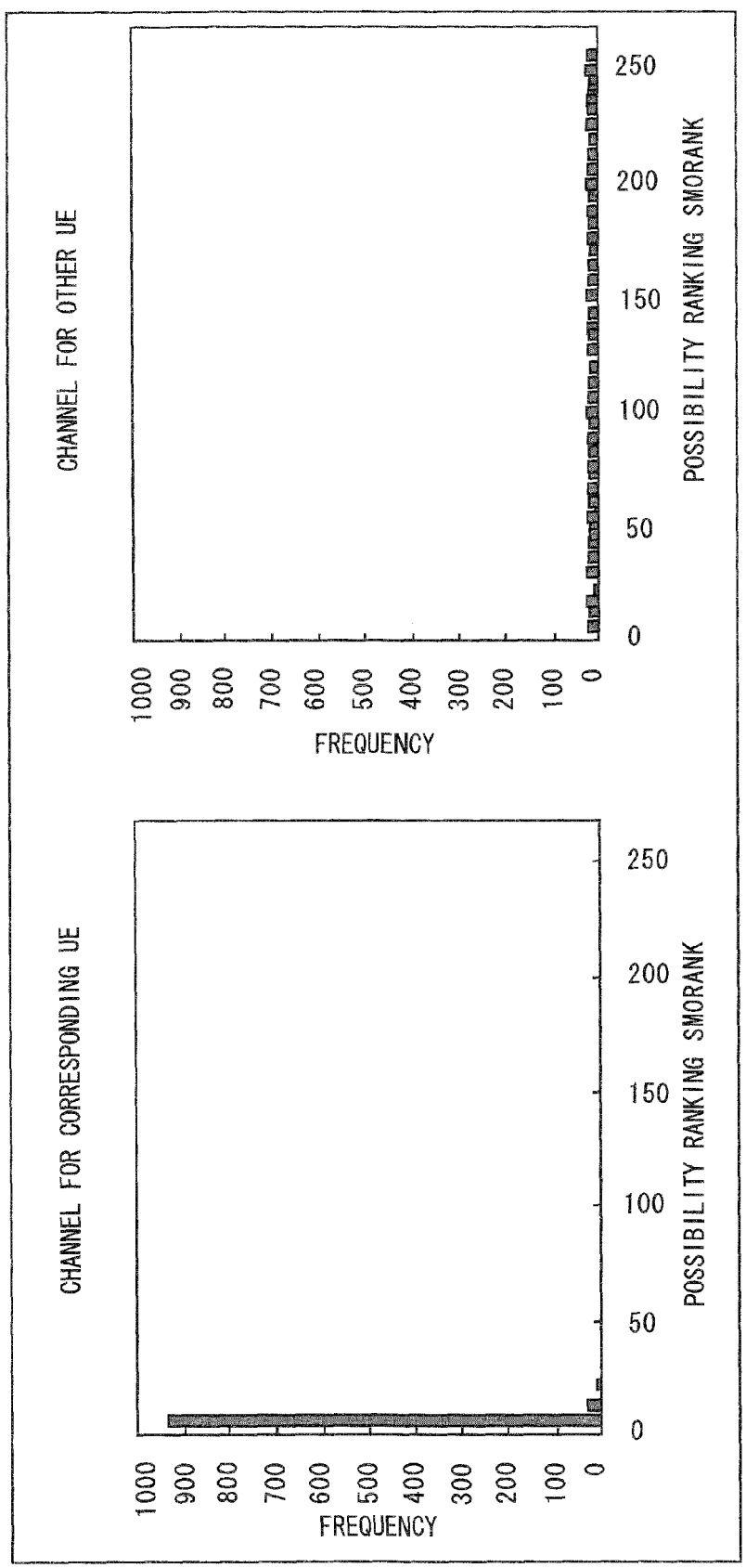
FIG. 2 explains a possibility ranking used by a second method according to an exemplary embodiment of the present invention.

FIG. 2 shows distribution of possibility rankings SM0RANK which are calculated for data of control channels for the UE and some other UE using 1000 samples. Note that FIG. 2 shows an example of decoding the PART1 of a HS-SCCH frame. The total number of states is 256 corresponding to constraint length 9 (which is the number of delay elements 8) of the encoder. Therefore, the possibility ranking SM0RANK can take the values from 1 to 256.

As shown in FIG. 2, the probability rankings SM0RANK are concentrated in the upper part of the graph for a control channel for the UE. On the other hand, the possibility rankings SM0RANK are distributed at random over the entire range from 1 to 256 for a control channel for some other UE.

Thus, data of a plurality of control channels is decoded to obtain the possibility rankings SM0RANK and a control channel having high probability rankings SM0RANK can be detected as the control channel for the receiving apparatus. Details are explained with reference to FIG. 3.

Figure 3:
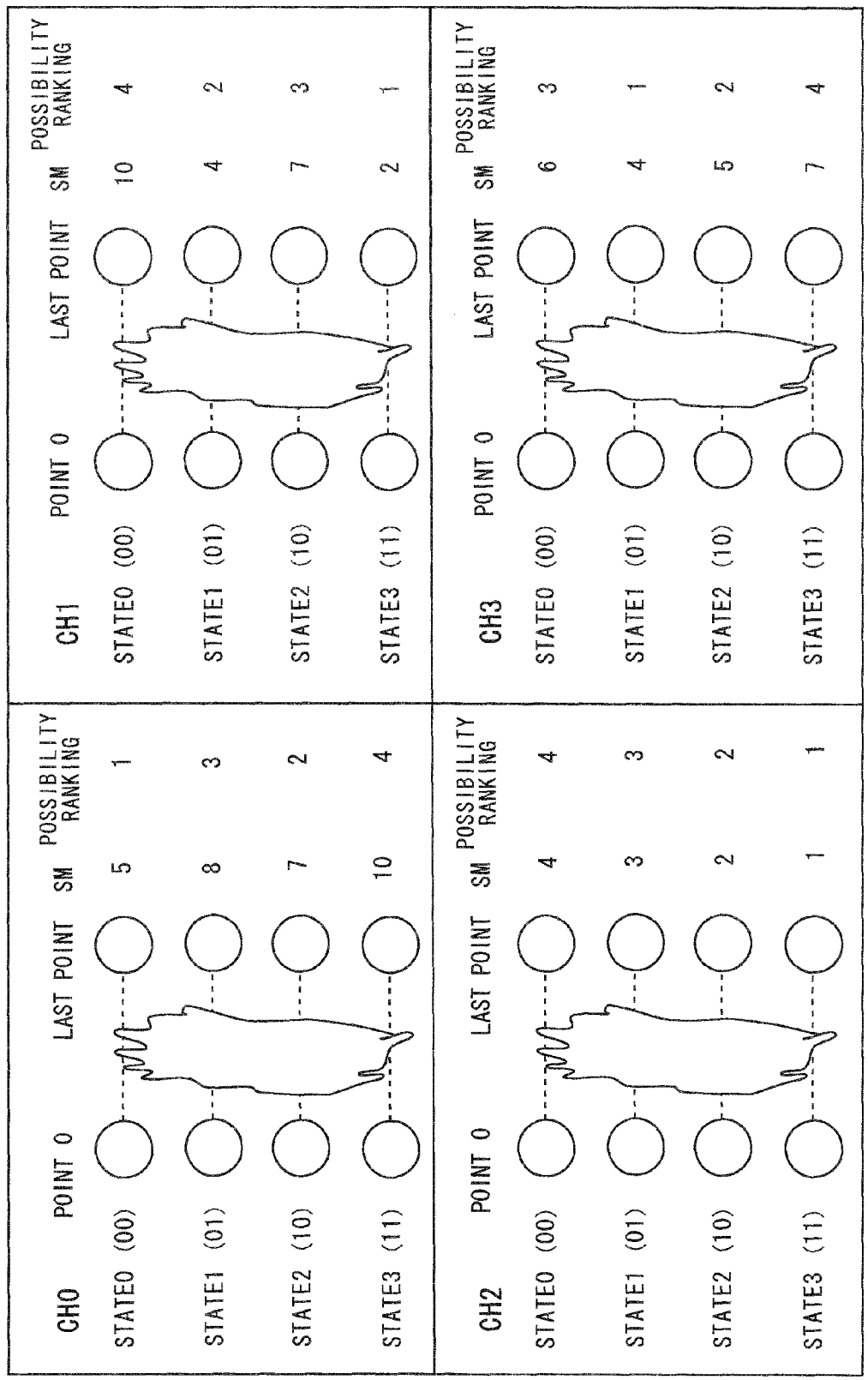
FIG. 3 explains a calculation method of the possibility ranking using the second method according to an exemplary embodiment of the present invention.

FIG. 3 shows an example when the total number of states is four. FIG. 3 illustrates a state metric value SM for each state at the last point and ranking of a likelihood indicated by the state metric value SM at each state.

For example, in the case of CH0, for four states from a state S0 (STATE0) to a state S3 (STATE3), the state metric values SM at the last point are 5, 8, 7 and 10, respectively. Since the likelihood is higher as the state metric value SM becomes smaller, the likelihood of each state is in the order of the state S0, state S2, state S1 and state S3. The probability ranking SM0RANK, which is the ranking of the state S0, is "1".

Similarly, in the case of CH1, CH2 and CH3, the possibility ranking SM0RANK is "4", "4" and "3", respectively.

Therefore, CH0 with the highest possibility ranking SM0RANK among these control channels has the highest possibility to be a channel for the receiving apparatus.

As can be seen from the example of FIG. 3, among the four channels, CH2 has the smallest state metric value SM at the state S0 but the possibility ranking SM0RANK is 4. Thus CH2 is less likely to be the control channel for the receiving apparatus than CH0 whose the state metric value SM at the state S0 is 5.

Figure 4:
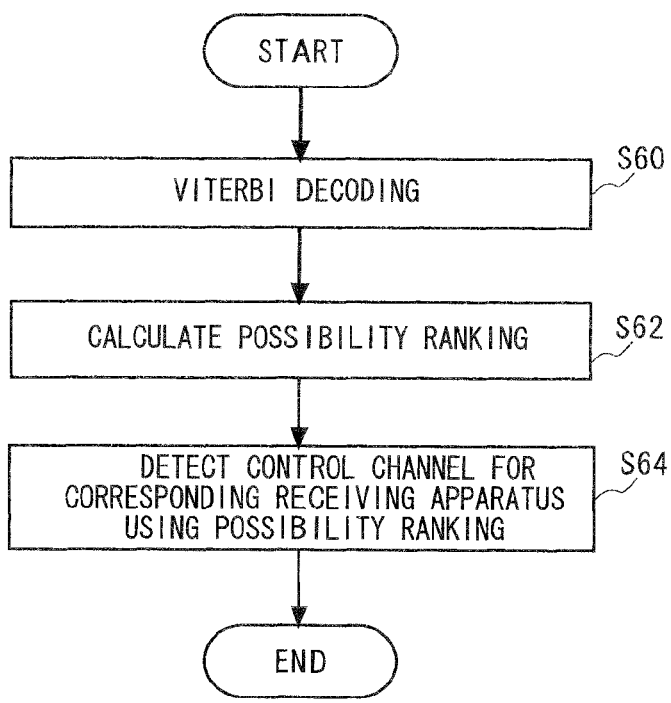
FIG. 4 is a flowchart showing the second method according to an exemplary embodiment of the present invention.

FIG. 4 is a flowchart showing the second method. First, Viterbi decoding is performed respectively to the data of a plurality of control channels received (S60). It is noted that decoding is not cut off but performed to the end.

Next, according to the state metric value SM of each state at the last point in the trellis for each control channel obtained by the decoding of the step S60, possibility rankings SM0RANK of the plurality of control channels are calculated (S62).

Then, the control channel for the receiving apparatus is detected using the possibility ranking SM0RANK of each control channel calculated in the step S62 (S64).

The second method uses the abovementioned probability ranking SM0RANK as an indicator for the probability of the control channel being the control channel for the receiving apparatus, instead of the state metric value SM0 at the state S0 of the last point in the trellis. As the possibility ranking SM0RANK is calculated by comparing the state metric value SM of each state at the last point for the same control channel, it is possible to avoid the influence of receiving intensity or noise of the control channel.

In the second method, a channel for the receiving apparatus can be detected by comparing the probability ranking SM0RANK between each control channel, for example by detecting a control channel with the highest probability ranking SM0RANK. However it is preferable to select control channels as candidate channels, which have high possibility to be the control channel for the receiving apparatus based on the probability ranking SM0RANK and then detect the channel for the receiving apparatus from the candidate channels. In this way, the possibility ranking SM0RANK allows to narrow down candidate channels without being influenced by receiving intensity or noise, thereby improving the accuracy of subsequent detection.

Figure 5:
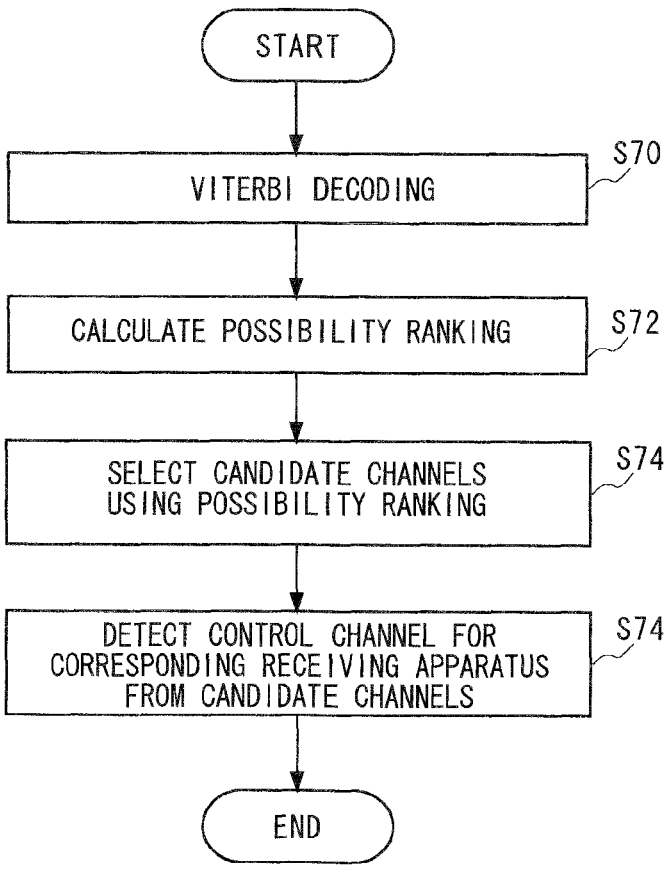
FIG. 5 is a flowchart showing an improved example of the second method according to an exemplary embodiment of the present invention.

FIG. 5 is a flowchart showing the procedure in this case. The processes up to the step S72 for calculating the possibility ranking are the same as those in the flowchart of FIG. 4. In the step S74, control channels with the possibility ranking of more or equal to a predetermined threshold (for example 20) are selected as candidate channels. Then, a control channel for the receiving apparatus is detected from the candidate channels (S74).

Note that a method of a related art may be used for the step S74 which detects a control channel for the receiving apparatus, however it is preferable to use the first method of the present invention. This will further improve the detection accuracy of a control channel for the receiving apparatus.

In light of the above explanation, the embodiment incorporating the principle of the present invention into a communication system complying with HSDPA is explained hereinafter.

Figure 6:
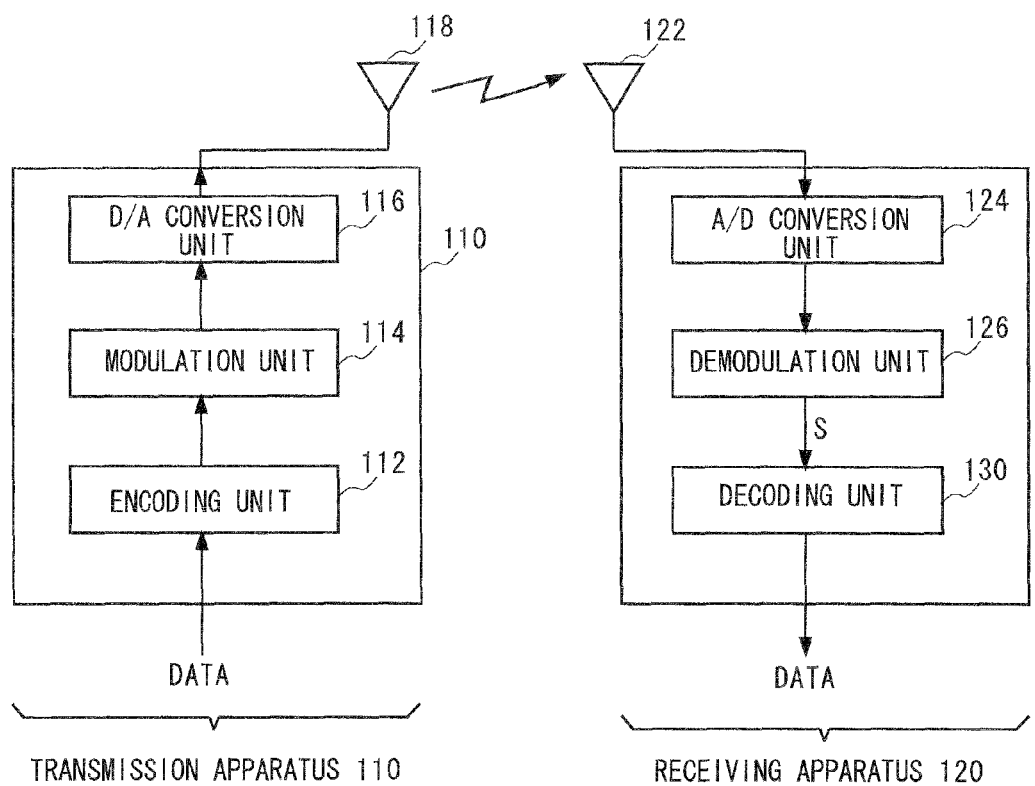
FIG. 6 shows a communication system according to an exemplary embodiment of the present invention.

FIG. 6 shows a communication system 100 according to an exemplary embodiment of the invention. The communication system 100, which complies with HSDPA, includes a transmission apparatus 100, such as a base station and the receiving apparatus 120, such as a user equipment.

The transmission apparatus 110 includes an encoding unit 112 for convolutionally coding transmission data, a modulation unit 114 for modulating encoded data obtained from the encoding unit 112, a D/A conversion unit 116 for performing D/A conversion to data modulated by the modulation unit 114 and an antenna 118 for outputting digital data obtained from the D/A conversion unit 116.

The receiving apparatus 120 includes an antenna 122 for receiving digital data transmitted from the transmission apparatus 110, an A/D conversion unit 124 for performing A/D conversion to digital data received from the antenna 122, a demodulation unit 126 for demodulating data converted by the A/D conversion unit 124 to obtain data S and a decoding unit 130 for decoding the data S obtained from the demodulation unit 126.

Each component of the communication system 100 is the same as a normal HSDPA communication system except the decoding unit 130 in the receiving apparatus 120. Thus they are not explained in detail here. The decoding unit 130 is the same as a normal HSDPA communication system except the part responsible for the processes concerning to decode the PART1 of a plurality of HS-SCCH frames upon receiving a plurality of HS-SCCH frames so as to detect a channel for the receiving apparatus. Therefore, only the part responsible for the processes concerning to detect a channel for the receiving apparatus from a plurality of HS-SCCH frames when receiving those frames is explained and illustrated for the decoding unit 130.

Figure 7:
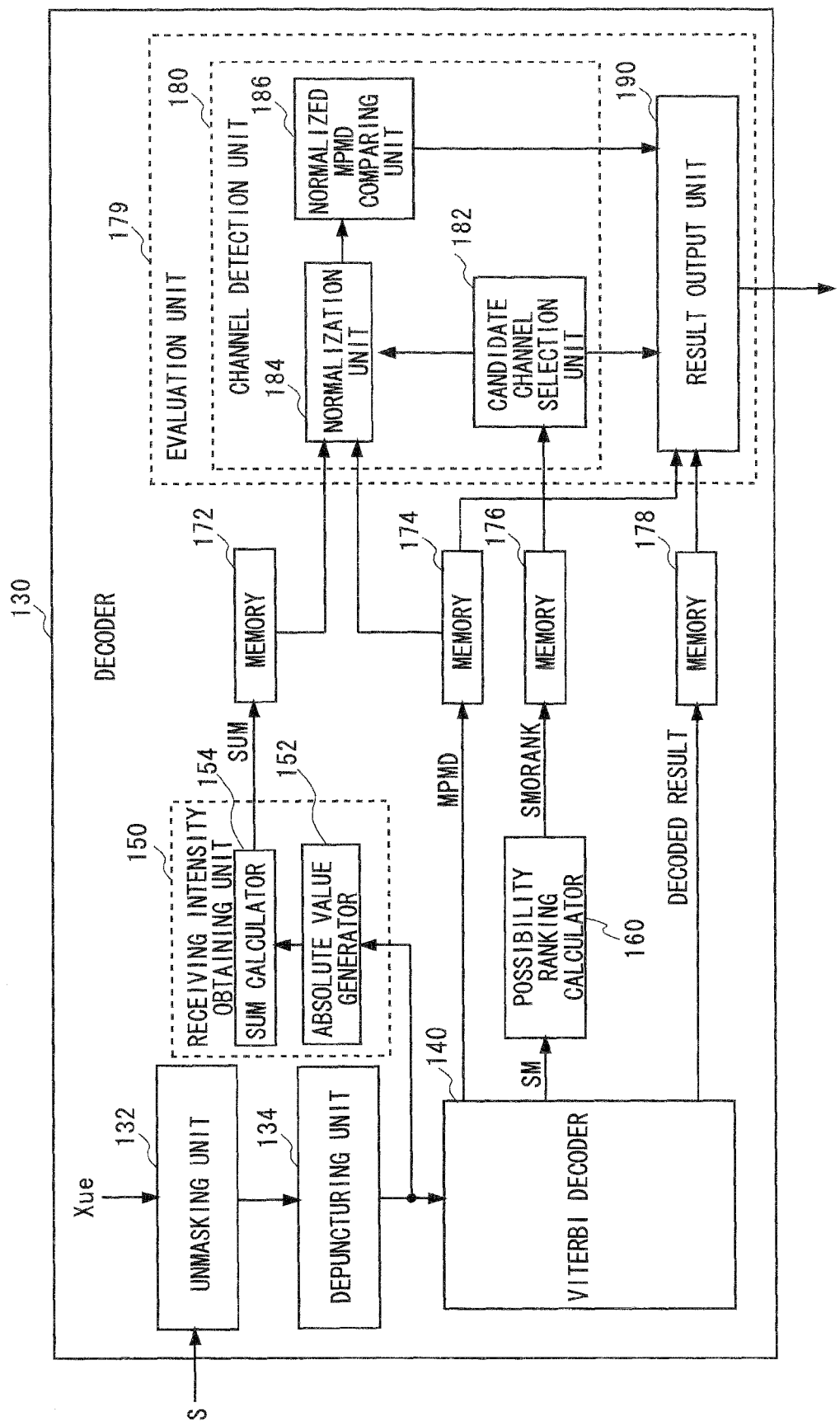
FIG. 7 shows a decoding unit in the receiving apparatus of the communication system shown in FIG. 1.

FIG. 7 illustrates the decoding unit 130. The decoding unit 130 includes an unmasking unit 132, a depuncturing unit 134, a Viterbi decoder 140, a receiving intensity obtaining unit 150, a possibility ranking calculator 160, a plurality of memories 172 to 178 and an evaluation unit 179. Moreover, the evaluation unit 179 includes a channel detection unit 180 and a result output unit 190. It is noted that in FIG. 7, each component described as a functional block for performing various processes can be constructed by a CPU, a memory and other circuit in terms of hardware. It can be realized by a program loaded in a memory in terms of software. Accordingly, a person skilled in the art will recognize that these functional blocks can be realized only by hardware, software or combination of those and it is not limited to either.

The unmasking unit 132 unmasks data S from the demodulation unit 126. In this example, the unmasking unit 132 unmasks data respectively corresponding to the PART1 of a plurality of HS-SCCH frames. The unmasking is performed by obtaining exclusive OR of Xue, which is convolutionally coded with an encoding rate of 1/2 for a UEID of the receiving apparatus 120 and data of the PART1 for each HS-SCCH. It is noted that only the data of the PART1 is used for the detection of a channel for the receiving apparatus. Thus in the following explanation of the decoding unit 130, the data of the PART1 of a HS-SCCH frame is merely referred to as data of HS-SCCH.

The depuncturing unit 134 depunctures, that is to refill a certain bit, the data of each HS-SCCH which is obtained by the unmasking unit 132. Then the depuncturing unit 134 generates 48-bit data and outputs it to the Viterbi decoder 140 and receiving intensity obtaining unit 150.

The receiving intensity obtaining unit 150 includes an absolute value generator 152 and a sum calculator 154. The receiving intensity obtaining unit 150 obtains an absolute value of each bit by the absolute value generator 152 for each HS-SCCH and calculates the sum of these absolute values by the sum calculator 152 as a receiving intensity SUM.

The receiving intensity SUM of each HS-SCCH calculated by the receiving intensity obtaining unit 150 is output and stored in the memory 172.

The Viterbi decoder 140 performs Viterbi decoding to the data of each HS-SCCH obtained from the depuncturing unit 134. Then the Viterbi decoder 140 outputs a decoded result, a state metric value SM of each state at the last point in the trellis and a minimum path metric difference MPMD to the memory 178, the possibility ranking calculator 160 and the memory 174, respectively.

Note that when decoding data (the PART1 in this example) of a HS-SCCH, the Viterbi decoder 140 does not cut off but decodes to the end. Therefore, the decoded result by the Viterbi decoder 140 is obtained from the state S0 (the state in which 0 is stored in all delay elements inside the encoder) at the last point in the trellis.

The memories 174 and 178 respectively store the minimum path metric difference MPMD and the decoded result from the Viterbi decoder 140.

The possibility ranking calculator 160 calculates the probability ranking SM0RANK of each HS-SCCH using the state metric value SM from the Viterbi decoder 140 and outputs it to the memory 176. The memory 176 stores the possibility ranking SM0RANK of each HS-SCCH obtained by the possibility ranking calculator 160.

The possibility ranking calculator 160 calculates the ranking of a likelihood indicated by the state metric value SM0 at the state S0 among the state metric value SM of each state at the last point in the trellis as the possibility ranking SM0RANK. The possibility ranking SM0RANK indicates the possibility of the HS-SCCH to be the channel for the receiving apparatus. The likelihood is lower as the state metric value SM value is larger, thus the likelihood ranking is reverse ranking of the state metric value SM.

The channel detection unit 180 includes a candidate channel selection unit 182, a normalization unit 184 and a normalized MPMD comparing unit 186. The channel detection unit 180 uses the receiving intensity SUM, the minimum path metric difference MPMD and the possibility ranking SM0RANK of each HS-SCCH which are respectively stored in the memories 172, 174 and 176 so as to detect a channel for the receiving apparatus 120 among these HS-SCCHs and outputs to the result output unit 190. The details of the channel detection unit 180 are described later.

The result output unit 190 performs the last evaluation whether the channel for the receiving apparatus which is detected by the channel detection unit 180 is the correct one. In this embodiment, this last evaluation is performed according to the minimum path metric difference MPMD of the corresponding HS-SCCH which is stored in the memory 174. Specifically, if the MPMD of the HS-SCCH detected by the channel detection unit 180 is more or equal to a predetermined MPMD, the result output unit 190 determines that the HS-SCCH is the channel for the receiving apparatus 120. On the other hand, if the MPMD of the HS-SCCH detected by the channel detection unit 180 is smaller than the abovementioned MPMD threshold, the result output unit 190 determines that the HS-SCCH is not a channel for the receiving apparatus. It means that there is no channel for the receiving apparatus.

As a result of the above last evaluation, only when the HS-SCCH detected by the channel detection unit 180 is evaluated as a channel for the receiving apparatus, the result output unit 190 reads out the decoded result of the corresponding HS-SCCH from the memory 178 and outputs it. It is noted that the decoded result output from the result output unit 190 is used to receive a HS-PDSCH which is received after a HS-SCCH.

The channel detection unit 180 is explained in detail hereinafter.

Figure 8:
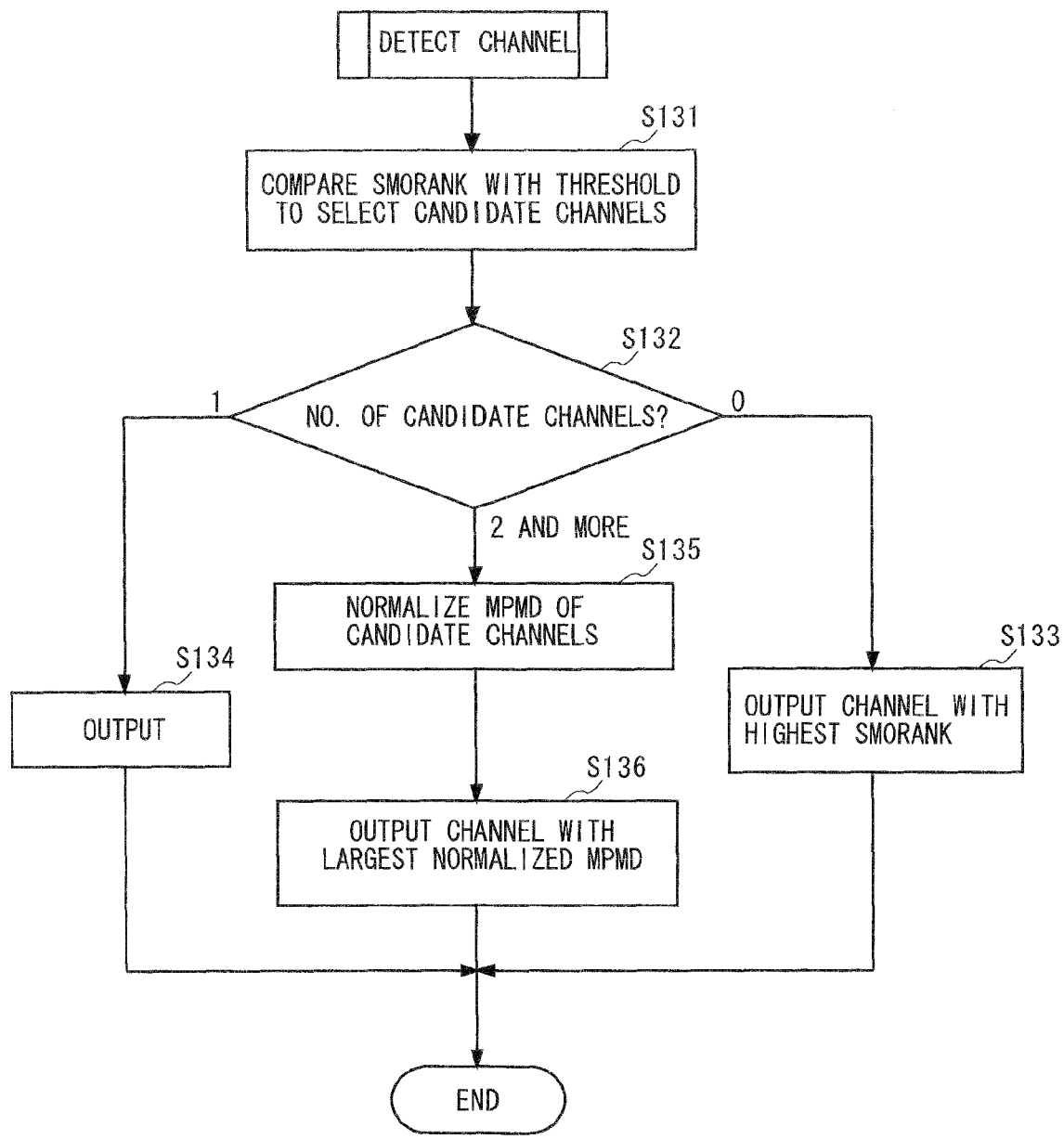
FIG. 8 is a flowchart showing the process of a channel detection unit in a decoding unit shown in FIG. 7.

FIG. 8 is a flowchart showing the channel detection process by the channel detection unit 180. Upon detection of a channel for the receiving apparatus, firstly the candidate channel selection unit 182 compares a possibility ranking SM0RANK of each HS-SCCH which is stored in the memory 176 with a predetermined threshold (for example 20). Then the candidate channel selection unit 182 selects a HS-SCCH having SM0RANK more than or equal to the threshold as a candidate channel (S131).

When the possibility ranking SM0RANK of all the HS-SCCH is below the threshold and there is no candidate channel, the candidate channel selection unit 182 outputs information of a HS-SCCH having the highest possibility channel SM0RANK among those HS-SCCHs (S132:0 and S133).

Moreover, when there is only one HS-SCCH to be a candidate channel, the candidate channel selection unit 182 outputs the information indicating the corresponding HS-SCCH to the result output unit 190 (S132:1 and S134).

Furthermore, when there is two or more HS-SCCHs to be candidate channels (S132:2), the candidate channel selection unit 182 outputs the information indicating those HS-SCCHs to the normalization unit 184.

The normalization unit 184 reads out a minimum path metric difference MPMD and a receiving intensity SUM (in this embodiment, sum or partial sum of absolute data of each received data) respectively from the memories 174 and 172 for each HS-SCCH which is notified by the candidate channel selection unit 182. Next, the normalization unit 184 divides the minimum path metric difference MPMD by the receiving intensity SUM to normalize the minimum path metric difference MPMD of each HS-SCCH to be a candidate channel so as to obtain a normalized MPMD (S135).

Then the normalized MPMD comparing unit 186 detects a HS-SCCH having the largest normalized MPMD among all HS-SCCHs to be candidate channels as a channel for the receiving apparatus and outputs the information indicating thereof to the output unit 190 (S136).

Figure 9:
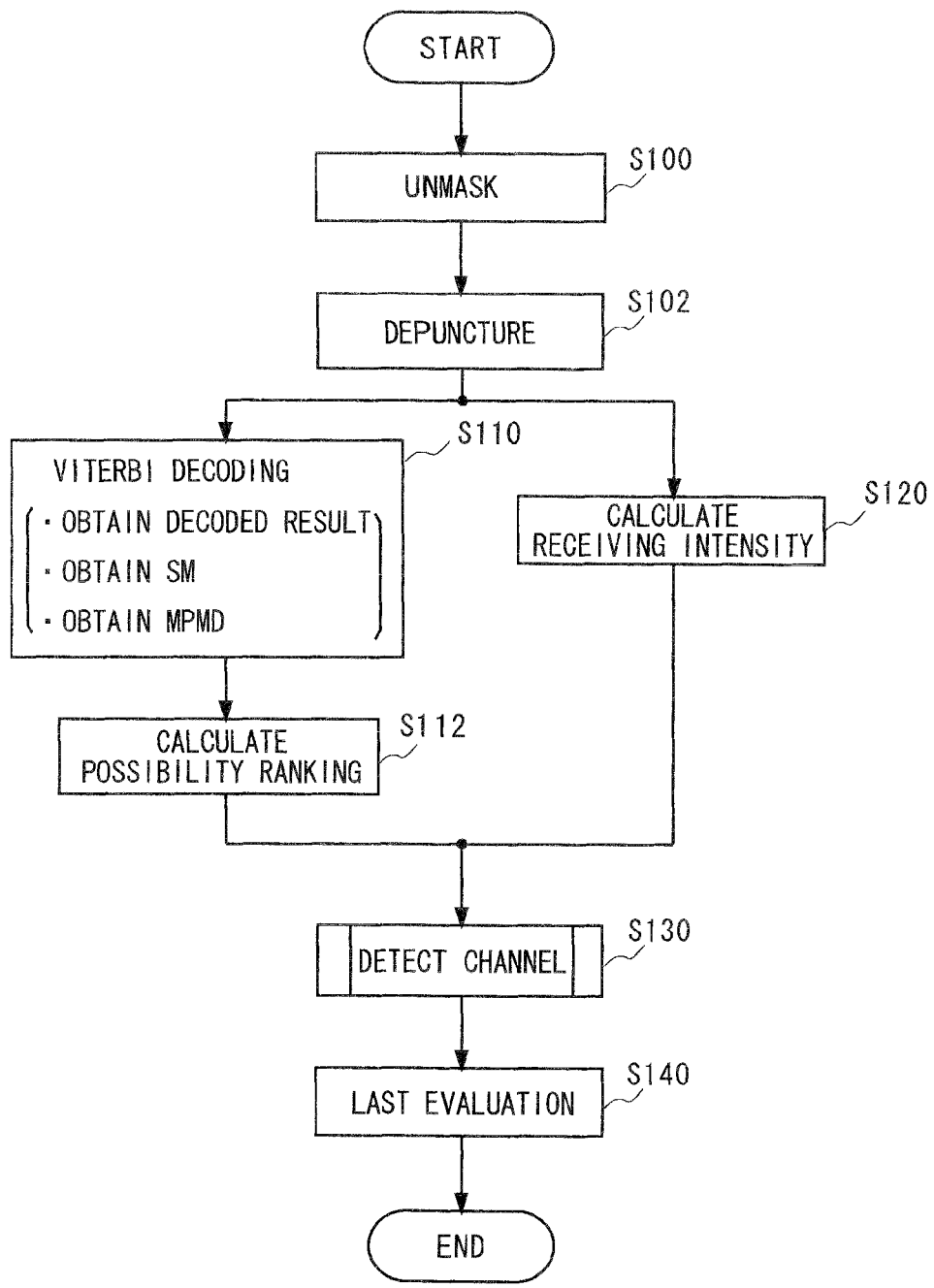
FIG. 9 is a flowchart showing processes by the decoding unit shown in FIG. 7.

FIG. 9 is a flowchart showing processes by the decoding unit 130. Data of each HS-SCCH from the decoding unit 126 is unmasked by the unmasking unit 132 Then a particular bit is refilled by the depuncturing unit 134 and the data is output Lo the Viterbi decoder 140 and the receiving intensity obtaining unit 150 (S100 and S102).

The Viterbi decoder 140 performs Viterbi decoding and obtains a decoded result, a state metric value SM of each state at the last point in the trellis and a minimum path metric difference MPMD for each HS-SCCH (S110).

The possibility ranking calculator 160 calculates a possibility ranking SM0RANK of each HS-SCCH using the state metric value SM which is obtained by the Viterbi decoder 140 (S112).

In parallel with the above process of the Viterbi decoder 140, the receiving intensity obtaining unit 150 calculates the sum of absolute values of data for each HS-SCCH as a receiving intensity SUM using the data of each HS-SCCH from the depuncturing unit 134 (S120).

Then, the channel detection unit 180 detects a channel for the receiving apparatus and outputs the information indicating thereof to the result output unit 190 (S130). Note that the channel detection of the step S130 is the process shown in FIG. 8.

The result output unit 190 compares the minimum path metric difference MPMD of the HS-SCCH detected by the channel detection unit 180 with a MPMD threshold to perform a last evaluation. If the HS-SCCH detected by the channel detection unit 180 is evaluated as a channel for the receiving apparatus, the result output unit 190 outputs the decoded result of the corresponding HS-SCCH (S140).

Figure 10:
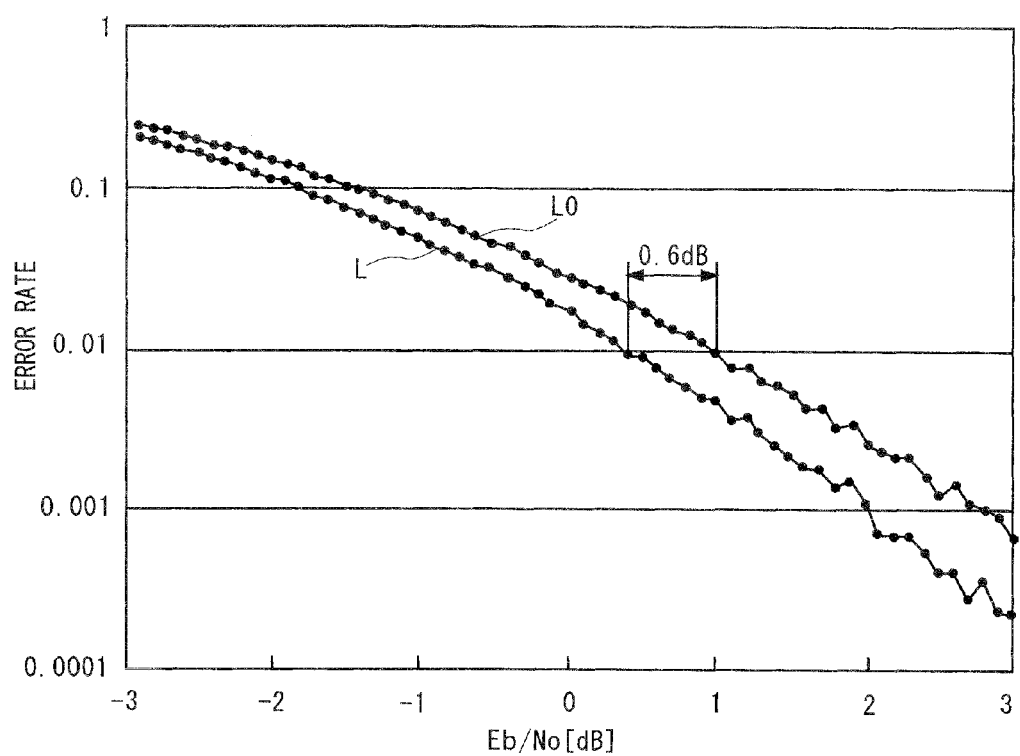
FIG. 10 compares detection accuracy of the channel detection unit in the decoding unit shown in FIG. 8 with a related art.

FIG. 10 shows the simulation result of the error rate in the detection by the channel detection unit 180 and the error rate of a method of a related art disclosed in Japanese Unexamined Patent Application Publication No. 2003-318745 in which a channel for a particular receiving apparatus is detected using a minimum path metric difference MPMD as it is. The horizontal axis is a signal to noise ratio (Eb/dB). The larger the receiving intensity or smaller the noise, the larger the value. Note that broken line L in the figure indicates the result of the channel detection unit 180. The broken line L0 indicates the result by the method of the related art.

As shown in the figure, the error rate of the detection by the channel detection unit 180 is smaller than that of the method of the related art over the entire area of Eb/dB value. This indicates that the channel detection unit 180 is able to detect a channel for the receiving apparatus more accurate than the method of the related art. For example, the channel detection unit 180 has improved the detection accuracy by 0.6 dB from the method of the related art for the error rate of 0.01.

Furthermore, in this embodiment, the result output unit 190 performs the last evaluation whether a HS-SCCH detected by the channel detection unit 180 is a correct channel for the receiving apparatus. This will further improve the detection accuracy.

Figure 11:
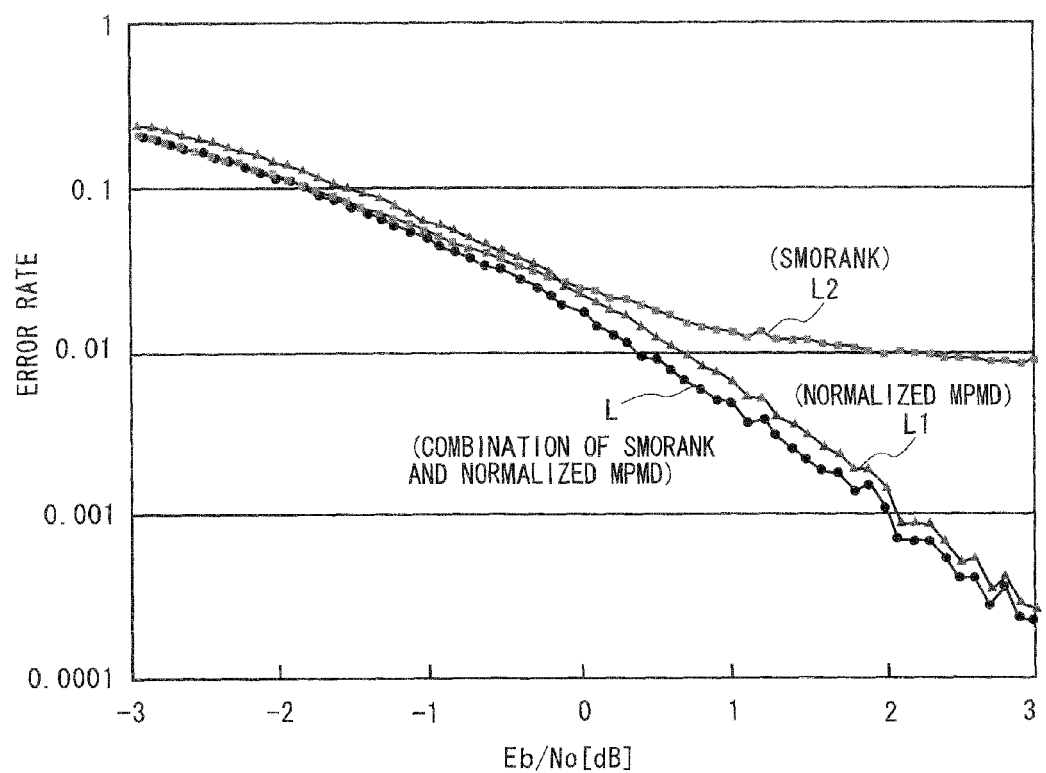
FIG. 11 explains characteristics of the first and the second methods according to an exemplary embodiment of the present invention.
Figure 12:
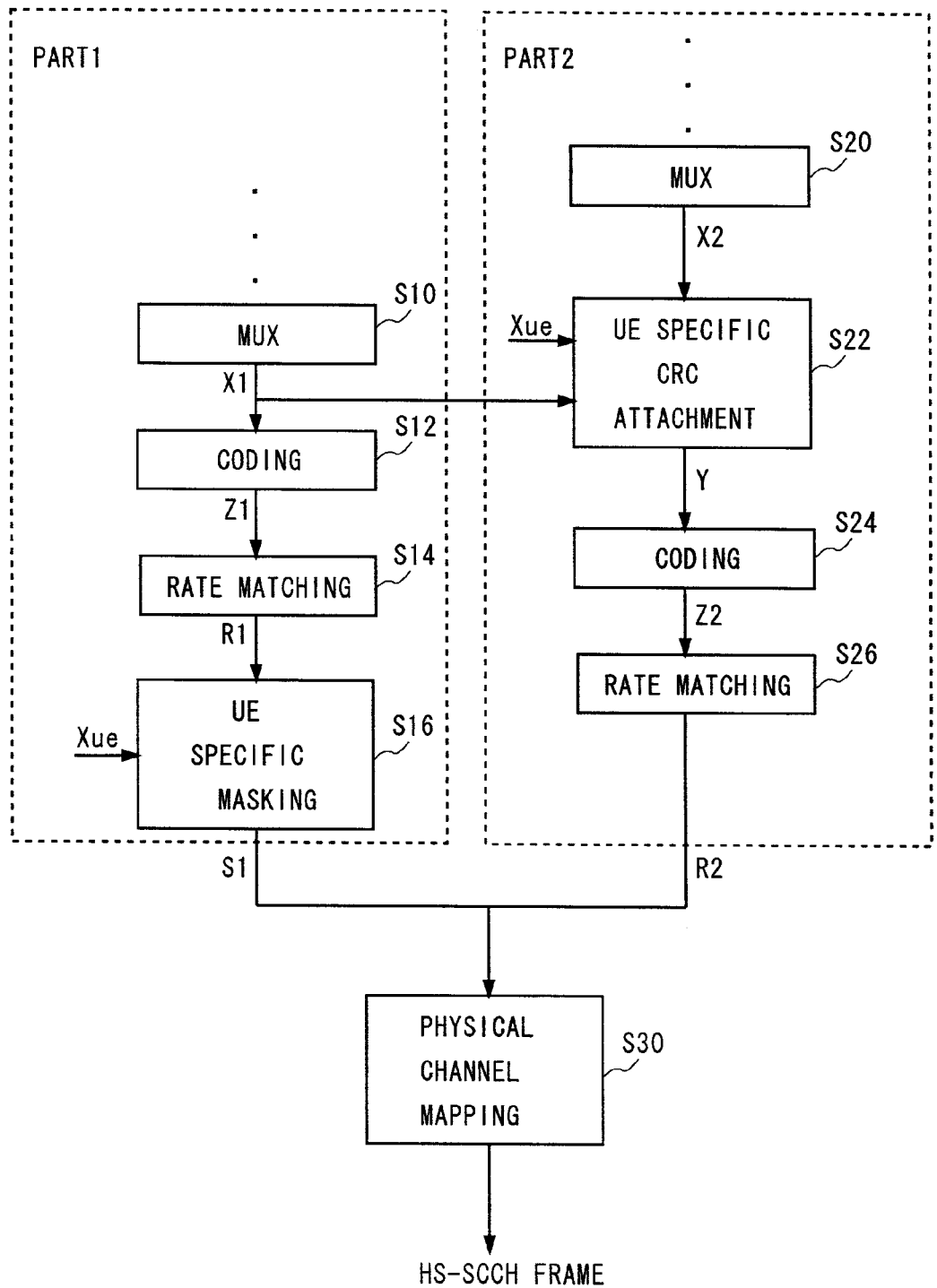
FIG. 12 shows a generation process of a HS-SCCH frame.
Figure 13:
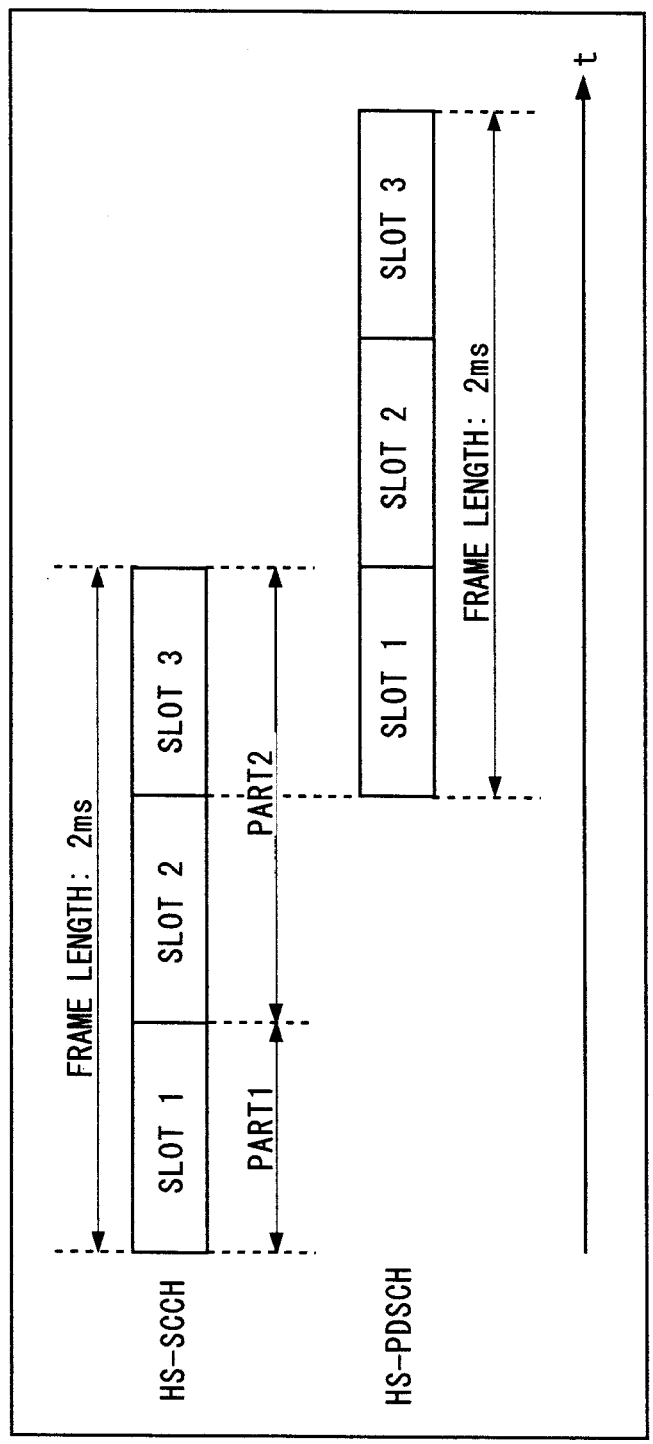
FIG. 13 shows a structure of a HS-SCCH and a HS-PDSCH frame and receive timing.
Figure 14:
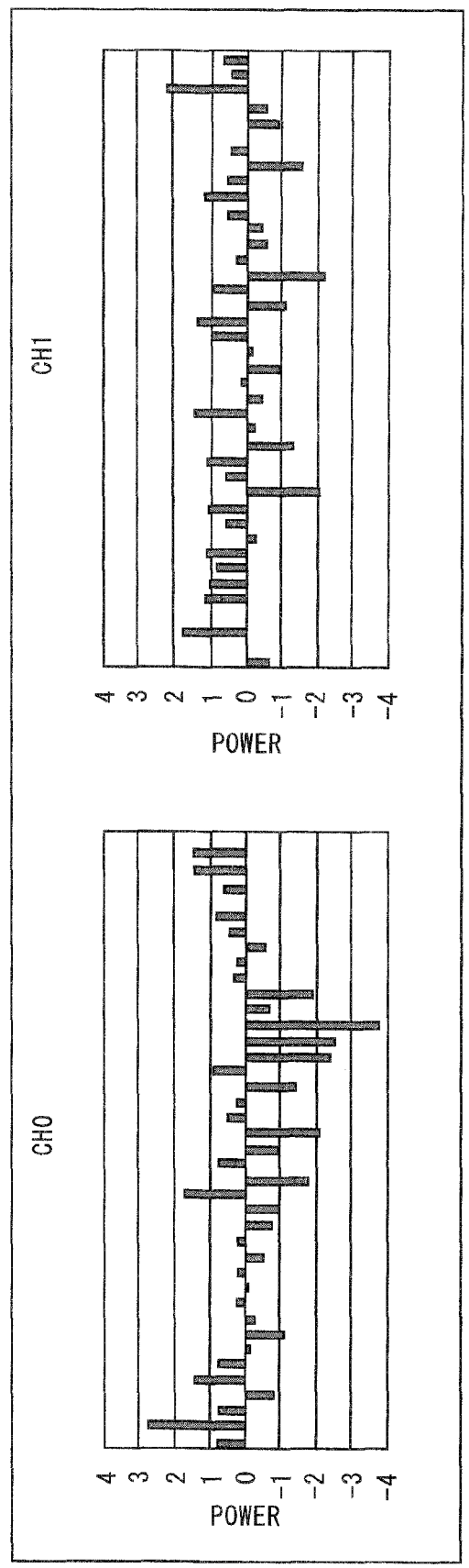
FIG. 14 shows an example of PART1 data of two HS-SCCH frames.

Here, the significance of using both the possibility ranking SM0RANK and the normalized MPMD for a detection of a channel for a particular a receiving apparatus as with the channel detection unit 180 is considered with reference to FIG. 11.

The broken line L in FIG. 11 is the same as the broken line L in FIG. 10 and indicates the error rate for the channel detection unit 180. The broken line L1 shows the error rate in case of detecting a HS-SCCH having the highest normalized likelihood (largest normalized MPMD) as a channel for a particular a receiving apparatus using the first method which is mentioned to explain the principle of the present invention, that is, using only the normalized output likelihood (normalized MPMD here). The broken line L2 shows the error rate in case of detecting a HS-SCCH having the highest possibility ranking SM0RANK as a channel for a particular receiving apparatus using the second method which is mentioned to explain the principle of the present invention, that is, using only the possibility ranking SM0RANK.

As can be seen from FIG. 11, the second method which uses only the possibility ranking SM0RANK when Eb/dB is less than or equal to 0 achieves higher detection accuracy than the first method which uses only the normalized MPMD. On the other hand, when Eb/dB is larger than zero, the first method has achieved higher detection accuracy than the second method.

That is, although both the normalized MPMD and the possibility ranking SM0RANK can indicate the possibility of being a channel for a particular receiving apparatus, they take on different characteristics according to the receiving intensity and noise. The first method using the minimum path metric difference MPMD is suitable for the cases with a large receiving intensity or small amount of noise. The second method using the possibility ranking SM0RANK is suitable for the cases opposite to the first method.

As shown in FIG. 11, in the case of the second method using the possibility ranking SM0RANK, even if there is almost no noise (Eb/dB=3), the error rate is little less than 0.01. This is because that a possibility ranking SM0RANK of a HS-SCCH for some other apparatuses can rank first with a probability of 1/256.

Therefore, it is possible to take advantage of the second method and also to cover disadvantage thereof by the second method selecting HS-SCCHs having higher possibility rankings SM0RANK as candidate channels as with the channel detection unit 180 and by the first method detecting a HS-SCCH having the largest normalized MPMD from the candidate channels as a channel for the receiving apparatus. As a result, as indicated by the broken line L of FIG. 11, an excellent detection accuracy can be achieved across the entire area of Eb/dB value.

The present invention has been explained according to an exemplary embodiment. The embodiment is illustrative only and various changes, additions and subtractions may be made unless departing from the scope of the present invention. A person skilled in the art will understand that modifications with such changes, additions and subtractions are within the scope of the present invention.

For example, the result output unit 190 uses the minimum path metric difference MPMD for the last evaluation in this embodiment. However it may use other parameters that could indicate the output likelihood of the Viterbi decoder 140, for example the aggregate path metric difference AMPD or state metric value SM (SM0 here) of the decoded result. It is needless to say that combination of a plurality of parameters that could indicate the output likelihood of the Viterbi decoder 140 may be used.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's Intent is to encompass equivalents of all claim elements, even if amended later during prosecution.

What is claimed is:

1. A receiving apparatus comprising:
   a decoder which executes a Viterbi algorithm to data included in a first channel to output a state metric of a state existing in a first point in a trellis diagram and executes a Viterbi algorithm to data included in a second channel to output a state metric of a state existing in a second point in the trellis diagram;
   a calculator which outputs a first and a second relative relationships, the first and the second relative relationships being relationships between a state metric of a certain state to start traceback existing in each of the first and the second points and a state metric of a different state existing in each of the first and the second points; and
   an evaluation unit which determines one of the first and the second channels as a channel to select according to the first and the second relative relationships.

2. The receiving apparatus according to claim 1, wherein the first relative relationship is a first possibility ranking which indicates how the state metric of the certain state to start traceback existing in the first point ranks among each state metric of each state existing in the first point.

3. The receiving apparatus according to claim 2, wherein the second relative relationship is a second possibility ranking which indicates how the state metric of the certain state to start traceback existing in the second point ranks among each state metric of each state existing in the second point, and
   the evaluation unit determines one of the first and the second channels as a channel to select according to a comparison result of the first and the second possibility rankings.

4. The receiving apparatus according to claim 3, wherein if the first possibility ranking is higher than the second possibility ranking as a result of a comparison between the first and the second possibility rankings, the evaluation unit determines the first channel as a channel to select.

5. The receiving apparatus according to claim 4, wherein each of the certain state to start traceback existing in the first and the second points is a state 0 in the trellis diagram.

6. The receiving apparatus according to claim 5, wherein the state 0 is a certain state to start traceback existing in each of the first and the second points based on that 0 is input to all delay elements included in an encoder of a data sender.

7. The receiving apparatus according to claim 3, wherein the evaluation unit further comprises a candidate channel selection unit which evaluates whether the first and the second possibility rankings are higher than a predetermined threshold, and
   the evaluation unit determines one of the first and the second channels as a channel to select according to the evaluation result of the candidate channel selection unit.

8. The receiving apparatus according to claim 7, wherein if the evaluation result by the candidate channel selection unit indicates that both of the first and the second possibility rankings are lower than the predetermined threshold, the evaluation unit determines a channel corresponding to a higher one of the first and the second possibility rankings as a channel to select.

9. The receiving apparatus according to claim 7, wherein if the evaluation result by the candidate channel selection unit indicates that one of the first and the second possibility rankings is higher than the predetermined threshold, the evaluation unit determines that a channel corresponding to the one of the first and the second possibility rankings as a channel to select.

10. The receiving apparatus according to claim 7, further comprising a receiving intensity obtaining unit which calculates a partial sum or a sum of absolute values of data included in the first channel and a partial sum or a sum of absolute values of data included in the second channel,
    wherein the decoder further calculates a first and a second minimum path metric differences for each of the certain state to start traceback existing in the first and the second points,
    the evaluation unit further comprises a normalization unit which normalizes each of the first and the second minimum path metric differences respectively by the partial sum or the sum of the first channel and by the partial sum or the sum of the second channel, and
    if the evaluation result by the candidate channel selection unit indicates that each of the first and the second possibility rankings is higher than the predetermined threshold, the receiving apparatus determines one of the first and the second channels as a channel to select based on the normalized first and the second minimum path metric differences.

11. The receiving apparatus according to claim 10, wherein the evaluation unit determines a channel corresponding to a larger one of the first and the second minimum path metric differences as a channel to select.

12. A receiving apparatus comprising:
    a decoder which executes a Viterbi algorithm to data included in a first channel so as to calculate a first likelihood for a certain state to start traceback among states existing at a first point in a trellis diagram and executes a Viterbi algorithm to data included in a second channel, which is different from the first channel, so as to calculate a second likelihood for a certain state to start traceback among states existing at a second point in the trellis diagram;

a receiving intensity obtaining unit which calculates a partial sum or a sum of absolute values of data included in the first channel and a partial sum or a sum of absolute values of data included in the second channel; and an evaluation unit which normalizes the first and the second likelihoods respectively by the partial sum or the sum of the first channel and by the partial sum or the sum of the second channel and determines one of the first and the second channels as a channel to select based on the normalized first and the second likelihoods.

13. The receiving apparatus according to claim 12, wherein the decoder calculates the first likelihood which is one of a minimum path metric difference, an aggregate path metric difference and a frequency path metric difference.

14. The receiving apparatus according to claim 12, wherein the decoder calculates the first likelihood which is based on a combination of a plurality of the minimum path metric difference, the aggregate path metric difference and the frequency path metric difference.

15. The receiving apparatus according to claim 14, wherein the decoder calculates the first likelihood which is based on a sum or an average of a plurality of the minimum path metric difference, the aggregate path metric difference and the frequency path metric difference.

* * * * *